United States Patent
Hershman et al.

(10) Patent No.: US 12,380,962 B2
(45) Date of Patent: Aug. 5, 2025

(54) RELIABLE PROGRAMMING OF ONE-TIME PROGRAMMABLE (OTP) MEMORY DURING DEVICE TESTING

(71) Applicant: Nuvoton Technology Corporation, Hsin-chu (TW)

(72) Inventors: Ziv Hershman, Givat Shmuel (IL); Dana Agur, Herzliya (IL); Alain Bismuth, Kibbutz Beth Rimon (IL)

(73) Assignee: Nuvoton Technology Corp., Hsinchu (TW)

( * ) Notice: Subject to any disclaimer, the term of this patent is extended or adjusted under 35 U.S.C. 154(b) by 33 days.

(21) Appl. No.: 18/332,735

(22) Filed: Jun. 11, 2023

(65) Prior Publication Data

US 2024/0412806 A1   Dec. 12, 2024

(51) Int. Cl.
*G11C 29/54* (2006.01)
*G06F 12/02* (2006.01)

(52) U.S. Cl.
CPC .......... *G11C 29/54* (2013.01); *G06F 12/0238* (2013.01); *G06F 2212/202* (2013.01)

(58) Field of Classification Search
CPC ....... G11C 29/54; G11C 17/146; G11C 17/18; G11C 29/027; G11C 29/08; G11C 29/18; G06F 12/0238; G06F 2212/202
See application file for complete search history.

(56) References Cited

U.S. PATENT DOCUMENTS

| | | | |
|---|---|---|---|
| 6,262,580 B1 | 7/2001 | Wu | |
| 7,029,932 B1 | 4/2006 | Hiser et al. | |
| 7,778,074 B2 | 8/2010 | Ahmed | |
| 8,379,861 B2 | 2/2013 | Akselrod et al. | |
| 9,685,958 B2 | 6/2017 | Bhunia et al. | |
| 10,037,438 B2 | 7/2018 | Pedersen | |
| 10,095,889 B2 | 10/2018 | Pedersen et al. | |
| 11,187,746 B2 | 11/2021 | Bismuth | |
| 11,495,313 B1 * | 11/2022 | Kirschner | G11C 29/006 |
| 11,636,907 B2 | 4/2023 | Hershman et al. | |

(Continued)

OTHER PUBLICATIONS

Liguori et al., "Automatic Test Equipment," Wiley 15 Encyclopedia of Electrical and Electronics Engineering, pp. 110-120, year 1999.

*Primary Examiner* — Albert Decady
*Assistant Examiner* — Enamul M Kabir
(74) *Attorney, Agent, or Firm* — Meitar Patents Ltd.; Daniel Kligler

(57) ABSTRACT

A method includes providing one or more signals to an electronic device for performing a test procedure that involves programming a One-Time Programmable (OTP) memory in the electronic device. A verification is made as to whether connection of the one or more signals to the electronic device is stable, by performing a sequence of one or more iterations, each iteration including (i) determining, from among a set of scratchpad addresses in the OTP memory, an address that is available for programming, (ii) writing a test value to the address, and then (iii) reading the test value from the address. If the read test value differs from the written test value, re-tuning of the connection of the one or more signals is initiated. Only when the connection is verified as stable by the sequence of iterations, the OTP memory is programmed in accordance with the test procedure.

20 Claims, 2 Drawing Sheets

(56) References Cited

U.S. PATENT DOCUMENTS

| | | |
|---|---|---|
| 11,726,923 B2 * | 8/2023 | Golov .................. H04L 9/0897 |
| | | 713/193 |
| 2002/0093359 A1 | 7/2002 | Babcock |
| 2009/0134905 A1 | 5/2009 | Long |
| 2009/0251165 A1 | 10/2009 | Ni |
| 2011/0156801 A1 | 6/2011 | Tong et al. |
| 2012/0089857 A1 * | 4/2012 | Sharma ............... G06F 13/4243 |
| | | 713/503 |
| 2013/0038340 A1 | 2/2013 | Masuda |
| 2014/0226426 A1 | 8/2014 | Uvieghara et al. |
| 2014/0253162 A1 | 9/2014 | Wang et al. |
| 2015/0155854 A1 | 6/2015 | Hayasaka et al. |
| 2016/0293268 A1 * | 10/2016 | Jan ........................ G11C 17/18 |
| 2017/0040067 A1 * | 2/2017 | Byun ..................... G11C 17/16 |
| 2018/0374554 A1 | 12/2018 | McWilliams |
| 2019/0026497 A1 | 1/2019 | Pedersen et al. |
| 2019/0065751 A1 | 2/2019 | Srinivas et al. |
| 2021/0264992 A1 | 8/2021 | Choi et al. |
| 2021/0306148 A1 * | 9/2021 | Lu ........................... G06F 7/584 |
| 2021/0350032 A1 | 11/2021 | Dover et al. |
| 2022/0276926 A1 * | 9/2022 | Li ...................... G06F 11/1004 |

* cited by examiner

RELIABLE PROGRAMMING OF ONE-TIME PROGRAMMABLE (OTP) MEMORY DURING DEVICE TESTING

FIELD OF THE INVENTION

The present invention relates generally to electronic devices, and particularly to methods and systems for programming of One-Time Programmable (OTP) memory.

BACKGROUND OF THE INVENTION

Electronic devices may comprise One-Time Programmable (OTP) memory for storing various device parameters. Parameters that may be stored in OTP memory may comprise, for example, the Life-Cycle (LC) state of the device. Since programming of OTP memory is irreversible, the programming process should be highly reliable.

SUMMARY OF THE INVENTION

An embodiment of the present invention that is described herein provides a method for testing electronic devices. The method includes providing, by a test system, one or more signals to an electronic device for performing a test procedure that involves programming a One-Time Programmable (OTP) memory in the electronic device. A verification is made as to whether connection of the one or more signals to the electronic device is stable, by performing a sequence of one or more iterations, each iteration including (i) determining, from among a set of scratchpad addresses in the OTP memory, an address that is available for programming, (ii) writing a test value to the address, and then (iii) reading the test value from the address. If the read test value differs from the written test value, re-tuning of the connection of the one or more signals is initiated. Only when the connection is verified as stable by the sequence of iterations, the OTP memory of the electronic device is programmed in accordance with the test procedure.

In some embodiments the method further includes outputting a failure indication upon finding that all the scratchpad addresses have been programmed but the connection is unstable. In an embodiment, the one or more signals include a clock signal that clocks at least part of the electronic device. Additionally or alternatively, the one or more signals include a power-supply signal that powers at least part of the electronic device.

In a disclosed embodiment, programming the OTP memory includes updating a Life-Cycle (LC) state of the electronic device in accordance with the test procedure. In an example embodiment, determining the address that is available for programming includes scanning the scratchpad addresses of the OTP memory for an address holding an all-zeros value. In an alternative embodiment, determining the address that is available for programming comprises maintaining a status of the OTP memory in a memory different from the OTP memory.

There is additionally provided, in accordance with an embodiment that is described herein, a method for testing electronic devices. The method includes, in an electronic device including a One-Time Programmable (OTP) memory, receiving from a test system one or more signals for performing a test procedure that involves programming of the OTP memory. A verification is made as to whether connection of the one or more signals to the electronic device is stable, by (i) determining, from among a set of scratchpad addresses in the OTP memory, an address that is available for programming, (ii) writing a test value to the address, (iii) reading the test value from the address, and (iv) verifying whether the read test value equals the written test value. If the connection is verified as stable, the OTP memory of the electronic device is programmed in accordance with the test procedure. If the connection is determined to be unstable, a failure indication is output.

There is also provided, in accordance with an embodiment that is described herein, an electronic device including a One-Time Programmable (OTP) memory and control hardware. The control hardware is configured to receive from a test system one or more signals for performing a test procedure that involves programming of the OTP memory, and to verify whether connection of the one or more signals to the electronic device is stable, by (i) determining, from among a set of scratchpad addresses in the OTP memory, an address that is available for programming, (ii) writing a test value to the address, (iii) reading the test value from the address, and (iv) verifying whether the read test value equals the written test value. The control hardware is configured to program the OTP memory in accordance with the test procedure if the connection is verified as stable, and to output a failure indication if the connection is determined to be unstable.

The present invention will be more fully understood from the following detailed description of the embodiments thereof, taken together with the drawings in which:

DETAILED DESCRIPTION OF EMBODIMENTS

Overview

Figure 1:
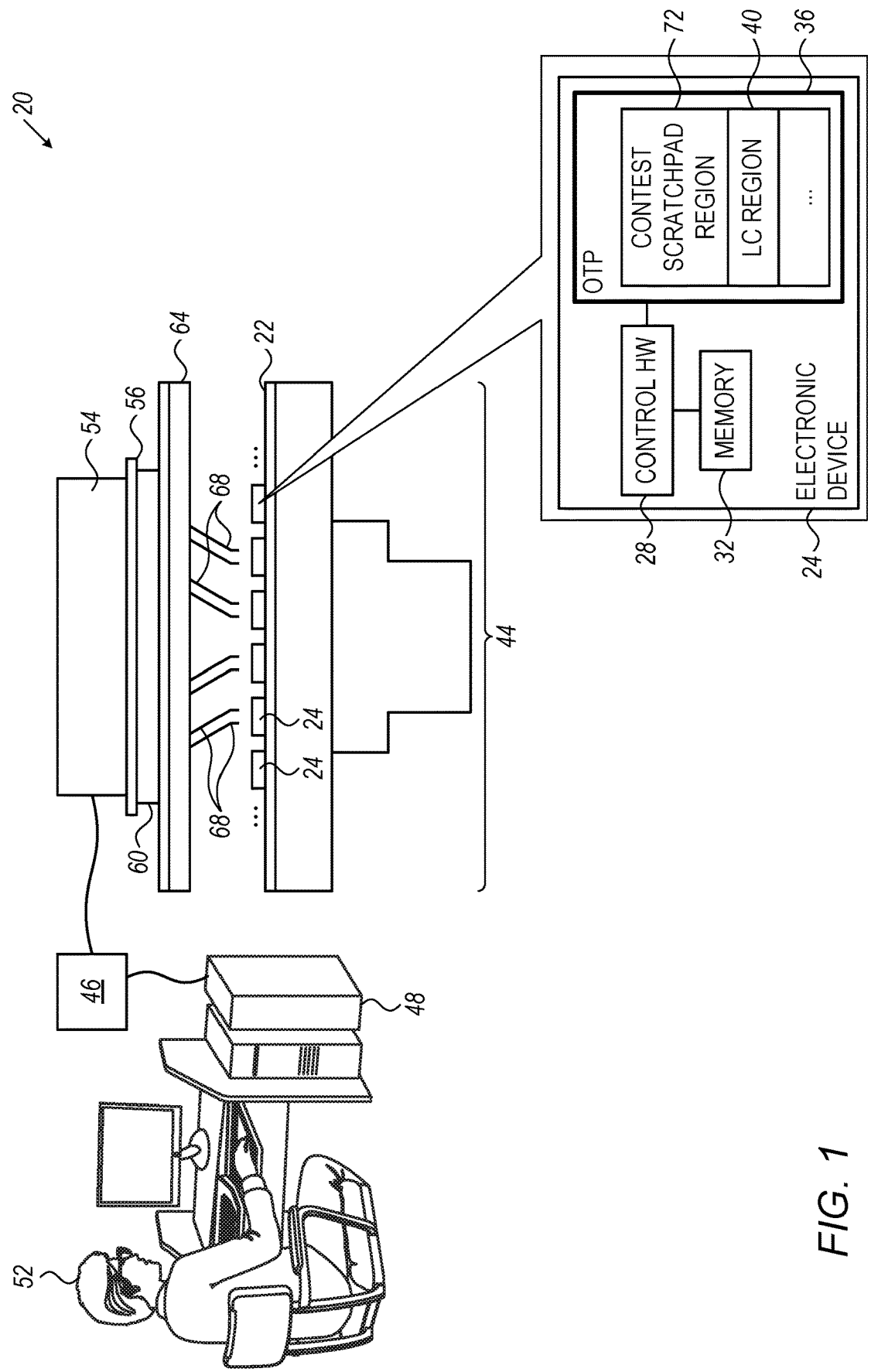
FIG. 1 is a diagram that schematically illustrates a system for testing electronic devices, including reliable programming of OTP memory, in accordance with an embodiment of the present invention.

Various electronic devices use One-Time Programmable (OTP) memory for storing device parameters. Some parameters, for example the device serial number or certain calibration parameters, are typically programmed only once. Other parameters, such as the device Life-Cycle (LC) state, may be updated along the lifetime of the device. When a parameter is updated or has to be re-programmed due to programming failure, the original OTP address cannot be reused. OTP programming failure may eventually render the device unusable. OTP memory is thus a sensitive resource that should be managed carefully.

A particularly problematic situation occurs when the OTP memory is programmed while the electronic device receives external signals, e.g., power supply and/or clock signals, from a test system. Consider, for example, a wafer-level test system that tests electronic devices fabricated on a wafer. Such a test system may supply power and/or clock signals to the devices using needles that touch the device pads. Any instability in the electrical connection of the needles to the device, and/or between internal components of the prober, may lead to unstable power and/or clock signals, possibly causing OTP programming failure.

The problem is further intensified because common practice is for a production line operator to begin the test procedure with a relatively weak connection of the needles and gradually try to improve it, to avoid damaging the device. This trial-and-error process increases the likelihood of OTP programming failures that considerably shorten the device lifetime.

Embodiments of the present invention that are described herein provide methods and systems for reliable programming of OTP memory. The disclosed techniques can be used in the context of a test system, or more generally when a device being programmed is supplied with signals over a potentially unstable connection.

In some disclosed embodiments, before programming the OTP memory of a device with actual device parameters, the stability of the electrical connection to the device is tested using a pre-programming connectivity test. The pre-programming connectivity test (referred to herein as "connectivity test" or "CONTEST" for brevity) utilizes a set of addresses, referred to as "scratchpad addresses", assigned in the OTP memory.

In an example flow, an operator sets-up electrical connections between a test system and one or more devices (typically multiple devices in parallel) and initiates the test procedure. Upon receiving a signal indicating that the test is initiated, each device scans the scratchpad addresses of its OTP memory for an address that is available for programming. The device writes a certain test value to the address and then reads the test value from the address.

If programming of the test value is successful, i.e., the read test value equals the written test value, the connection is considered stable and the test procedure proceeds, including programming the OTP memory with the applicable LC state. If programming of the test value has failed, i.e., the read test value differs from the written test value, the connection is regarded unstable and the device outputs a failure indication. In response to the failure indication, the operator re-tunes the connection in an attempt to improve its stability, and re-initiates the test procedure.

The iterative process described above may continue until the electrical connection to the device becomes stable and the LC state is programmed successfully. The iterative process may fail if all the scratchpad addresses are written-to before the connection is stabilized. In such a case the device typically outputs a fatal failure indication. In a typical implementation, a sufficient number of scratchpad addresses is assigned to support the expected number of LC updates along the lifetime of the device.

In alternative embodiments, the disclosed CONTEST can be implemented using a different "division-of-labor" between the test system and the tested devices. For example, more of the test logic may be implemented on the test system side.

The techniques described herein ensure that critical information, for example LC states or other device parameters, are programmed to OTP memory only when the connection of external signals to the device is stable. The disclosed techniques therefore enhance the reliability of OTP programming, and increase the reliability and yield of the overall device production process.

System Description

FIG. 1 is a diagram that schematically illustrates a test system 20 for testing a wafer 22 having electronic devices 24 disposed thereon, in accordance with an embodiment of the present invention. Electronic devices 24 may comprise, for example, Non-Volatile Memory (NVM) devices, microcontrollers, or any other suitable electronic devices. Devices 24 are also referred to herein as "Devices Under Test" (DUTs).

An inset at the bottom-right of FIG. 1 shows a simplified internal structure of device 24, in accordance with an example embodiment. As seen, device 24 comprises control hardware (HW) 28, a memory 32 (which may be volatile or non-volatile), and a One-Time Programmable (OTP) memory 36. Control hardware 28 is responsible for programming OTP memory 36 using techniques that are described herein.

OTP memory 36 is used for storing various parameters of device 24. At least some of the information stored in OTP memory 36 is considered critical, and should therefore be programmed with very high reliability. The description below refers mainly to the LC state of device 24, as an example of such critical information. This choice, however, is made purely for the sake of clarity. The disclosed techniques are applicable in a similar manner to any other suitable information, critical or otherwise, stored in OTP memory 36.

In the example embodiment of FIG. 1, an LC region 40 is assigned in the OTP memory for storing the current LC state of the device. Examples of LC states include "DEFAULT", "TEST", "DEVELOP", "OPERATION", "RMA", etc. The LC state is an extremely sensitive parameter, for both operational and security reasons. Errors or discrepancies in the LC state may render the device unusable, or transition the device to an illegal state.

The LC state of a given device 24 changes several times over the device lifetime, e.g., following production testing before being shipped, and even upon being transferred between different stations during production and testing. To enable updating the LC state multiple times, LC region 40 comprises multiple addresses. Typically, the size of LC region 40 is chosen so as to allow for a sufficient number of updates of the LC state over the device lifetime.

In the embodiment of FIG. 1, system 20 comprises a tester 46 that is connected to a prober 44. Tester 46 and prober 44 are controlled by a computer 48 operated by an operator 52. Wafer 22 is mounted in prober 44 for performing a test procedure. Prober 44 comprises a test head 54, a load board 56, a pogo ring 60 and a probe card 64. Multiple needles 68 extend from probe card 64 toward wafer 22. Needles 68 are configured to make electrical contact with selected pads of devices 24 as part of the applicable test procedure. Needles 68 can be used, for example, to provide power supply and clock signals to devices 24, as well as to inject and extract test signals to and from device 24. Typically, prober 44 tests a group of devices 24 at a time. A given device 24 is typically contacted by multiple needles 68.

In practice, the electrical connection between prober 44 and devices 24 may vary in quality. In the present example, the connections (i) between test head 54 and load board 56, (ii) between load board 56 and pogo ring 60, and (iii) between pogo ring 60 and probe card 64, all comprise pogos, i.e., spring-loaded contacts. Any and all of these contacts may have electrical connection stability issues. Electrical connection stability issues may also arise between needles 68 and devices 24. In the present context, phrases such as "the connection between prober and device" and "stability of the connection", in various grammatical forms, refer to any of the above described connections, as well as to any other relevant connection in system 20, between components of prober 44 or between prober 44 and devices 24.

Conventionally, operator 52 typically begins a test procedure by setting a relatively weak connection between needles 68 and devices 24, to minimize the risk of damaging the devices. If the initial connection is not sufficiently stable, operator 52 typically makes one or more attempts to improve it, until achieving a sufficiently good connection for conducting the test procedure.

Assuming the test procedure involves updating critical information, such as LC state update, the trial-and-error set-up process described above is problematic. If each attempt to reposition needles 68 is accompanied by an update of the LC state, wrong data may be written to the OTP memory. Erroneous programming of the LC state, for example, may lock the device irrecoverably or otherwise render it useless.

Thus, in some embodiments system 20 carries out a pre-programming connectivity test ("CONTEST"), which verifies the stability of the electrical connection between needles 68 and devices 24. Typically, programming of actual information (e.g., LC state) in OTP memory 36 is permitted, i.e., the device is considered ready for OTP programming, only upon successful completion of the CONTEST.

The disclosed CONTEST uses a set of addresses, referred to as a scratchpad region 72, assigned in OTP memory 36. Region 72 may be contiguous or non-contiguous. In an example embodiment region 72 comprises thirty-two addresses, allowing for thirty-two programming attempts. Each address stores a 16-bit word. In some embodiments, although not necessarily, region 72 is located for convenience at the beginning of OTP memory 36, i.e., at offset 0. When accessing scratchpad region 72, both Built-In Self-Test (BIST) and Error Correction Coding (ECC) are disabled. Alternatively, however, any other suitable configuration can be used. The pre-programming connectivity test and the use of region 72 are described in detail below.

The configurations of system 20 and device 24, as seen in FIG. 1, are example configurations that are chosen purely for the sake of conceptual clarity. Any other suitable configurations can be used in alternative embodiments. For example, prober 44 may comprise any other suitable contacts, not necessarily needles, for contacting devices 24. The configuration of FIG. 1 pertains to wafer-level Chip Probing (CP) testing, by way of example. In alternative embodiments, the disclosed techniques can be used in Final Testing (FT) of packaged devices. In a FT implementation, devices 24 are packaged devices, and the electrical connection being verified includes the connection between prober 44 and selected pins of the packaged devices.

The various elements of system 20 and devices 24 may be implemented using any suitable hardware, such as in one or more Application-Specific Integrated Circuits (ASICs) or Field-Programmable Gate Arrays (FPGAs), using software, or using a combination of hardware and software elements. In some embodiments, computer 48 comprises one or more general-purpose processors, which are programmed in software to carry out the functions described herein. The software may be downloaded to any of the processors in electronic form, over a network, for example, or it may, alternatively or additionally, be provided and/or stored on non-transitory tangible media, such as magnetic, optical, or electronic memory.

Reliable Programming of OTP Memory During Testing

For various reasons, in some test procedures prober 44 provides one or more power-supply signals and/or one or more clock signals to devices 24 during the test. For example, some tests may require a clock signal having higher accuracy than the internal clock of device 24. As another example, some tests may require a high supply voltage that cannot be generated by the internal power-supply circuitry of device 24. In one non-limiting example, a test has to be performed at a high temperature, at which the device's internal power supply is unable to produce the necessary voltage level.

As can be appreciated, it is very risky to program OTP memory 36 with actual device parameters (e.g., LC state) while device 24 is powered and/or clocked externally. Therefore, in some embodiments control hardware 28 of device 24 performs a pre-programming connectivity test ("CONTEST") before programming OTP memory 36 with actual device parameters.

Figure 2:
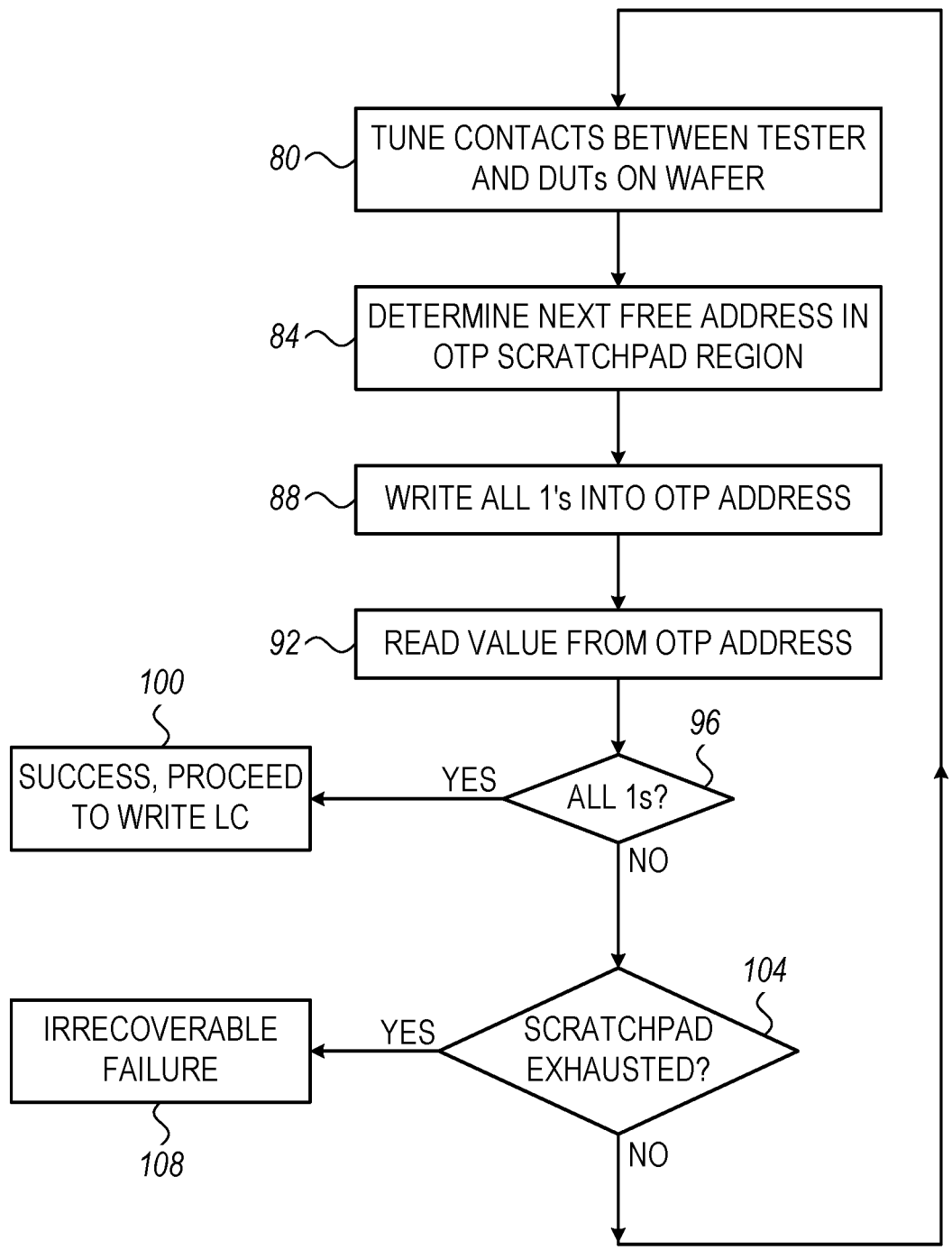
FIG. 2 is a flow chart that schematically illustrates a method for reliable programming of OTP memory during testing, in accordance with an embodiment of the present invention.

FIG. 2 is a flow chart that schematically illustrates a method for reliable programming of OTP memories 36 of devices 24 during testing, in accordance with an embodiment of the present invention. The method begins with operator 52 tuning contacts that transfer signals between prober 44 and devices 24, at a tuning stage 80. After tuning the contacts, operator 52 initiates the CONTEST by issuing a "start" command.

In response to the "start" command, in a given device 24, control hardware 28 determines the next address in scratchpad region 72 that is available for programming, at a free address selection stage 84. In an example embodiment, control hardware 28 determines the next available address by scanning scratchpad region 72 in sequential order. For each address being scanned, control hardware 28 reads the address and checks whether the read value is an all-zeros word. If so, the address is considered available for programming. If not, the address is considered used and control hardware 28 proceeds to the next address in region 72.

Having found the next available address in scratchpad region 72, control hardware 28 writes a test value to that address, at a test value programming stage 88. In an example embodiment, the test value is an all-ones word. Alternatively, any other suitable test value can be used. However, the more bits that are set, the more reliable connectivity is guaranteed. At a test value readout stage 92, control hardware 28 reads the address that was just programmed.

At a test value checking stage 96, control hardware 28 checks whether the read value is indeed an all-ones word (or, more generally, whether the test value read at stage 92 is equal to the test value programmed at stage 88).

If the read test value is equal to the written test value (all-ones in the present example), the connection to device 24 is considered stable. The method terminates at a success termination stage 100. Control hardware 28 (and system 20 as a whole) proceeds to perform the test procedure, including programming the appropriate LC state in LC region 40 of OTP memory 36.

If, on the other hand, stage 96 reveals that the read test value differs from the written test value (all-ones in the present example), control hardware 28 regards the CONTEST as failed. At an availability checking stage 104, control hardware 28 checks whether scratchpad region 72 has remaining free addresses, i.e., addresses available for programming. If no free addresses remain in scratchpad region 72, the method terminates at a failure termination stage 108. In this event, control hardware 28 typically outputs a fatal error indication, signaling prober 44 that device 24 is irrecoverably faulty.

If stage 104 reveals that there are one or more free addresses remaining in scratchpad region 72, control hardware 28 typically outputs a failure indication, notifying prober 44 that the test has failed. This failure, however, is not a fatal failure, and is used as an indication to operator 52 that re-tuning of contacts is needed. The method then loops back to stage 80, in which operator 52 re-tunes the contacts that deliver signals to devices 24.

In the example above, the pre-programming connectivity test is carried out by control hardware 28 in device 24 as part of the overall test procedure. In this implementation, prober 44 and operator 52 are not necessarily aware that a pre-programming connectivity test is being performed. From the perspective of prober 44 and operator 52, device 24 is instructed to perform a test, and returns a pass/fail result. A fail result does not necessarily indicate whether the failure is due to failure of the test itself or of the pre-programming connectivity test. In alternative embodiments, any other suitable implementation can be used.

The flow of FIG. 2 above is an example flow that is depicted purely for the sake of conceptual clarity. In alternative embodiments, the disclosed techniques can be carried out using any other suitable flow.

For example, in an alternative embodiment, instead of scanning region 72 to find the next available address, control hardware 28 may record the identity of the next available address in some memory other than OTP memory 36, e.g., in memory 32. At stage 84, control hardware 28 typically reads the value from this address to verify it is indeed all-zeros, before proceeding to stage 88. After completing stage 88, control hardware 28 increments the identity of the next available address.

In one embodiment, the prober issues the instruction to initiate the test, and reads the result, by writing and reading one or more JTAG registers of device 24. In alternative embodiments, any other suitable implementation can be used.

Typically, measures should be taken to prevent other (hardware or software) entities from accessing OTP memory 36 during the CONTEST.

Although the embodiments described herein mainly address applications involving programming of OTP memory, the methods and systems described herein can also be used in other applications, such as in other systems and scenarios in which it is desirable to avoid retesting.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for testing electronic devices, the method comprising:
   providing, by a test system, one or more external signals to an electronic device for performing a test procedure that involves programming of a One-Time Programmable (OTP) memory in the electronic device;
   verifying whether the one or more external signals are connected stably to the electronic device, by performing a sequence of one or more iterations, each iteration comprising:
      determining, from among a set of scratchpad addresses in the OTP memory, an address that is available for programming;
      writing a test value to the address, and then reading the test value from the address; and
      if the read test value differs from the written test value, initiating re-tuning of a connection of the one or more external signals; and
   only when the one or more external signals are verified by the sequence of iterations as connected stably to the electronic device, programming the OTP memory of the electronic device in accordance with the test procedure.

2. The method according to claim 1, further comprising outputting a failure indication upon finding that all the scratchpad addresses have been programmed but the one or more external signals are still connected unstably.

3. The method according to claim 1, wherein the one or more external signals comprise a clock signal that clocks at least part of the electronic device.

4. The method according to claim 1, wherein the one or more external signals comprise a power-supply signal that powers at least part of the electronic device.

5. The method according to claim 1, wherein programming the OTP memory comprises updating a Life-Cycle (LC) state of the electronic device in accordance with the test procedure.

6. The method according to claim 1, wherein determining the address that is available for programming comprises scanning the scratchpad addresses of the OTP memory for an address holding an all-zeros value.

7. The method according to claim 1, wherein determining the address that is available for programming comprises maintaining a status of the OTP memory in a memory different from the OTP memory.

8. The method according to claim 1, wherein:
   the one or more external signals are provided to the electronic device via a connection comprising (i) one or more needles for contacting the electronic device, and/or (ii) one or more spring-loaded contacts; and
   verifying whether the one or more external signals are connected stably comprises verifying whether the needles and/or spring-loaded contacts are connected stably.

9. A method for testing electronic devices, the method comprising:
   in an electronic device comprising a One-Time Programmable (OTP) memory, receiving from a test system one or more external signals for performing a test procedure that involves programming of the OTP memory;
   verifying whether the one or more external signals are connected stably to the electronic device, by:
      determining, from among a set of scratchpad addresses in the OTP memory, an address that is available for programming; and
      writing a test value to the address, reading the test value from the address, and verifying whether the read test value equals the written test value;
   if the one or more external signals are verified as connected stably to the electronic device, programming the OTP memory of the electronic device in accordance with the test procedure; and
   if the one or more external signals are not verified as connected stably to the electronic device, outputting a failure indication.

10. The method according to claim 9, further comprising outputting a fatal failure indication upon finding that all the scratchpad addresses have been programmed but the connection is unstable.

11. The method according to claim 9, wherein the one or more external signals comprise a clock signal that clocks at least part of the electronic device.

12. The method according to claim 9, wherein the one or more external signals comprise a power-supply signal that powers at least part of the electronic device.

13. The method according to claim 9, wherein programming the OTP memory comprises updating a Life-Cycle (LC) state of the electronic device in accordance with the test procedure.

14. The method according to claim 9, wherein determining the address that is available for programming comprises scanning the scratchpad addresses of the OTP memory for an address holding an all-zeros value.

15. An electronic device, comprising:
a One-Time Programmable (OTP) memory; and
control hardware, configured to:
  receive from a test system one or more external signals for performing a test procedure that involves programming of the OTP memory;
  verify whether the one or more external signals are connected stably to the electronic device is stable, by:
    determining, from among a set of scratchpad addresses in the OTP memory, an address that is available for programming; and
    writing a test value to the address, reading the test value from the address, and verifying whether the read test value equals the written test value;
  if the one or more external signals are verified as connected stably to the electronic device, program the OTP memory in accordance with the test procedure; and
  if the one or more external signals are determined not to be connected stably to the electronic device, output a failure indication.

16. The electronic device according to claim 15, wherein the control hardware is further configured to output a fatal failure indication upon finding that all the scratchpad addresses have been programmed but the connection is unstable.

17. The electronic device according to claim 15, wherein the one or more external signals comprise a clock signal that clocks at least part of the electronic device.

18. The electronic device according to claim 15, wherein the one or more external signals comprise a power-supply signal that powers at least part of the electronic device.

19. The electronic device according to claim 15, wherein, in programming the OTP memory, the control hardware is configured to update a Life-Cycle (LC) state of the electronic device in accordance with the test procedure.

20. The electronic device according to claim 15, wherein the control hardware is configured to determine the address that is available for programming by scanning the scratchpad addresses of the OTP memory for an address holding an all-zeros value.

* * * * *